(12) United States Patent
Ngo et al.

(10) Patent No.: US 12,400,904 B2
(45) Date of Patent: Aug. 26, 2025

(54) THERMAL PROCESSING SUSCEPTOR (71) Applicant: Applied Materials, Inc., Santa Clara, CA (US)

(72) Inventors: Anhthu Ngo, San Jose, CA (US); Zuoming Zhu, Sunnyvale, CA (US); Balasubramanian Ramachandran, Cupertino, CA (US); Paul Brillhart, Pleasanton, CA (US); Edric Tong, Sunnyvale, CA (US); Anzhong Chang, San Jose, CA (US); Kin Pong Lo, Fremont, CA (US); Kartik Shah, Saratoga, CA (US); Schubert S. Chu, San Francisco, CA (US); Zhepeng Cong, San Jose, CA (US); James Francis Mack, Woodside, CA (US); Nyi O. Myo, San Jose, CA (US); Kevin Joseph Bautista, San Jose, CA (US); Xuebin Li, Sunnyvale, CA (US); Yi-Chiau Huang, Fremont, CA (US); Zhiyuan Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/539,507

(22) Filed: Dec. 14, 2023

(65) Prior Publication Data

US 2024/0112945 A1   Apr. 4, 2024

Related U.S. Application Data (60) Division of application No. 17/183,146, filed on Feb. 23, 2021, now Pat. No. 11,848,226, which is a
(Continued)

(51) Int. Cl.
*H01L 21/687* (2006.01)
*B05C 13/00* (2006.01)
(Continued)

(52) U.S. Cl.
CPC ........ *H01L 21/68735* (2013.01); *B05C 13/00* (2013.01); *B05C 13/02* (2013.01);
(Continued)

(58) Field of Classification Search
CPC ........... H01L 21/68735; H01L 21/6875; H01L 21/68785; H01L 21/67115;
(Continued)

(56) References Cited

U.S. PATENT DOCUMENTS

| 3,539,759 A | 11/1970 | Spiro et al. |
| 4,493,977 A | 1/1985 | Arai et al. |

(Continued)

FOREIGN PATENT DOCUMENTS

| JP | 05-238882 A | 9/1993 |
| JP | 07-058039 A | 3/1995 |

(Continued)

OTHER PUBLICATIONS

Susceptor; Patent No. 2004128271; Document ID: JP 2004128271 A; Date Published: Apr. 22, 2004; Inventor: Nomura Toshio; Date Filed: Oct. 3, 2002 (Year: 2004).*

(Continued)

*Primary Examiner* — Mahdi H Nejad
(74) *Attorney, Agent, or Firm* — Patterson + Sheridan, LLP (57) ABSTRACT In one embodiment, a susceptor for thermal processing is provided. The susceptor includes an outer rim surrounding and coupled to an inner dish, the outer rim having an inner edge and an outer edge. The susceptor further includes one or more structures for reducing a contacting surface area
(Continued)

between a substrate and the susceptor when the substrate is supported by the susceptor. At least one of the one or more structures is coupled to the inner dish proximate the inner edge of the outer rim.

20 Claims, 5 Drawing Sheets

Related U.S. Application Data continuation of application No. 16/109,945, filed on Aug. 23, 2018, now Pat. No. 10,930,543, which is a division of application No. 14/698,793, filed on Apr. 28, 2015, now Pat. No. 10,062,598.

(60) Provisional application No. 62/001,562, filed on May 21, 2014.

(51) Int. Cl.
  *B05C 13/02* (2006.01)
  *C30B 25/12* (2006.01)
  *H01L 21/67* (2006.01)
  *H01L 21/673* (2006.01)
  *H01L 21/683* (2006.01)
  *C23C 16/458* (2006.01)

(52) U.S. Cl.
  CPC ........ *C30B 25/12* (2013.01); *H01L 21/67326* (2013.01); *H01L 21/6875* (2013.01); *H01L 21/68785* (2013.01); *C23C 16/4583* (2013.01); *C23C 16/4585* (2013.01)

(58) Field of Classification Search
  CPC ......... H01L 21/67109; H01L 21/68742; C30B 25/12; C23C 16/4585; C23C 16/4584; C23C 16/4583
  See application file for complete search history.

(56) References Cited

U.S. PATENT DOCUMENTS

| | | | |
|---|---|---|---|
| 5,382,311 A | 1/1995 | Ishikawa et al. | |
| 6,394,797 B1 | 5/2002 | Sugaya et al. | |
| 6,639,189 B2 | 10/2003 | Ramanan et al. | |
| 7,573,004 B1 | 8/2009 | Tompa | |
| 7,607,647 B2 | 10/2009 | Zhao et al. | |
| 7,646,580 B2 | 1/2010 | Nakamura et al. | |
| 7,960,254 B2 | 6/2011 | Wada et al. | |
| 8,021,484 B2 | 9/2011 | Narahara et al. | |
| 8,753,448 B2 | 6/2014 | Yasuhara et al. | |
| 9,267,204 B2 | 2/2016 | Honma | |
| 9,428,833 B1 | 8/2016 | Duvall et al. | |
| 9,799,548 B2 | 10/2017 | Sheelavant et al. | |
| 9,835,388 B2 | 12/2017 | Gowdaru et al. | |
| 11,764,101 B2* | 9/2023 | Rathi | H01L 21/6875 438/795 |
| 2002/0043337 A1 | 4/2002 | Goodman et al. | |
| 2003/0140850 A1 | 7/2003 | Keeton et al. | |
| 2004/0040664 A1* | 3/2004 | Yang | H01J 37/321 156/345.51 |
| 2005/0061447 A1 | 3/2005 | Kim et al. | |
| 2005/0193952 A1 | 9/2005 | Goodman et al. | |
| 2007/0205788 A1 | 9/2007 | Natsuhara et al. | |
| 2009/0031955 A1 | 2/2009 | Lu et al. | |
| 2010/0055316 A1 | 3/2010 | Honma | |
| 2010/0059478 A1 | 3/2010 | Lee et al. | |
| 2011/0318142 A1 | 12/2011 | Gage et al. | |
| 2012/0108081 A1 | 5/2012 | Olgado et al. | |
| 2012/0146191 A1 | 6/2012 | Yasuhara et al. | |
| 2013/0055952 A1 | 3/2013 | Subramani et al. | |
| 2013/0109192 A1* | 5/2013 | Hawkins | H01L 21/6875 438/758 |
| 2013/0168020 A1 | 7/2013 | Hashiguchi et al. | |
| 2013/0264035 A1 | 10/2013 | Goel et al. | |
| 2014/0105582 A1 | 4/2014 | Tallavarjula et al. | |
| 2014/0113458 A1 | 4/2014 | Pan et al. | |
| 2014/0265091 A1* | 9/2014 | Sheelavant | H01L 21/68735 269/14 |
| 2015/0072256 A1 | 3/2015 | Audebert et al. | |
| 2015/0118825 A1* | 4/2015 | Ishizuka | H01J 37/32412 438/458 |
| 2015/0368829 A1 | 12/2015 | Ngo et al. | |
| 2016/0064196 A1 | 3/2016 | Okita et al. | |
| 2016/0064268 A1 | 3/2016 | Lin et al. | |
| 2016/0133504 A1 | 5/2016 | Chu et al. | |
| 2016/0204005 A1 | 7/2016 | Oki et al. | |
| 2016/0281263 A1 | 9/2016 | Oki et al. | |
| 2016/0375534 A1 | 12/2016 | Park et al. | |
| 2017/0148626 A1 | 5/2017 | Subramani et al. | |
| 2017/0191159 A1* | 7/2017 | Polyak | C23C 16/463 |

FOREIGN PATENT DOCUMENTS

| | | | |
|---|---|---|---|
| JP | H09199437 A | | 7/1997 |
| JP | 2002151412 A | * | 5/2002 |
| JP | 2022550336 A | * | 12/2002 |
| JP | 2004-119859 A | | 4/2004 |
| JP | 2004-128019 A | | 4/2004 |
| JP | 2004-128271 A | | 4/2004 |
| KR | 20010067805 A | | 7/2001 |
| KR | 10-0984177 B1 | | 9/2010 |

OTHER PUBLICATIONS

Korean Office Action dated Apr. 15, 2024 for Application No. 10-2023-7024914.
Chinese Office Action dated Nov. 16, 2018 for Chinese Application No. 201580023377.1.
PCT Notification of Transmittal of the International Search Report and the Written Opinion of the International Searching Authority for International Application No. PCT/US2015/028054 dated Jul. 30, 2015; 15 total pages.
English Translation, summarizing Taiwan Official Letter, dated Aug. 3, 2018.
Chinese Office Action dated Feb. 6, 2020 for Chinese Application No. 201580023377.1.
Korean Office Action dated Jan. 27, 2025 for Application No. 10-2023-7024914.

* cited by examiner

THERMAL PROCESSING SUSCEPTOR

CROSS-REFERENCE TO RELATED APPLICATIONS

This application is a divisional of U.S. patent application Ser. No. 17/183,146, filed Feb. 23, 2021, which is a continuation of U.S. patent application Ser. No. 16/109,945, filed Aug. 23, 2018, which is a divisional of U.S. patent application Ser. No. 14/698,793, filed Apr. 28, 2015, which claims benefit of U.S. Provisional Patent Application Ser. No. 62/001,562, filed on May 21, 2014, which are each herein incorporated by reference.

FIELD

Embodiments of the present disclosure generally relate to a susceptor for thermal processing of semiconductor substrates, and more particularly to a susceptor having features to improve thermal uniformity across a substrate during processing.

BACKGROUND

Semiconductor substrates are processed for a wide variety of applications, including the fabrication of integrated devices and microdevices. One method of processing substrates includes depositing a material, such as a dielectric material or a conductive metal, on an upper surface of the substrate. Epitaxy is one deposition process that is used to grow a thin, ultra-pure layer, usually of silicon or germanium on a surface of a substrate in a processing chamber. Epitaxy processes are able to produce such quality layers by maintaining highly uniform process conditions, such as temperature, pressures, and flow rates, within the processing chambers. Maintaining highly uniform process condition in areas around the upper surface of the substrate is necessary for producing the high-quality layers.

Susceptors are often used in epitaxy processes to support the substrate as well as heat the substrate to a highly uniform temperature. Susceptors often have platter or dish-shaped upper surfaces that are used to support a substrate from below around the edges of the substrate while leaving a small gap between the remaining lower surface of the substrate and the upper surface of the susceptor. Precise control over a heating source, such as a plurality of heating lamps disposed below the susceptor, allows a susceptor to be heated within very strict tolerances. The heated susceptor can then transfer heat to the substrate, primarily by radiation emitted by the susceptor.

Despite the precise control of heating the susceptor in epitaxy, temperature non-uniformities persist across the upper surface of the substrate often reducing the quality of the layers deposited on the substrate. Undesirable temperature profiles have been observed near the edges of the substrate as well as over areas closer to the center of the substrate. Therefore, a need exists for an improved susceptor for supporting and heating substrates in semiconductor processing.

SUMMARY

In one embodiment, a susceptor for thermal processing is provided. The susceptor includes an outer rim surrounding and coupled to an inner dish, the outer rim having an inner edge and an outer edge. The susceptor further includes one or more structures for reducing a contacting surface area between a substrate and the susceptor when the substrate is supported by the susceptor, wherein at least one of the one or more structures is coupled to the inner dish proximate the inner edge of the outer rim.

In another embodiment, a susceptor for a thermal processing chamber is provided. The susceptor includes an outer rim surrounding and coupled to an inner dish, the outer rim having an inner edge and an outer edge. The susceptor further includes one or more elevated structures relative to an upper surface of the inner dish, the one or more elevated structures to reduce a contacting surface area between the susceptor and a substrate to be supported by the susceptor, wherein at least one of the elevated structures is coupled to the inner dish at a location proximate the inner edge of the outer rim.

In another embodiment, a susceptor for a thermal processing chamber is provided. The susceptor includes an outer rim surrounding and coupled to an inner dish, the outer rim having an inner edge and an outer edge. The susceptor further includes six wedges extending radially inward from the inner edge of the outer rim above the inner dish, wherein each wedge is separated from two other wedges by a gap. The susceptor further includes a quartz insulating separator disposed between each of the wedges. Each quartz insulating separator contacting two wedges and the inner edge of the outer rim. The susceptor further includes three bumps extending from an upper surface of the inner dish. Each bump is located closer than each wedge to a center of the inner dish, wherein no bisection of the inner dish comprises all three bumps.

BRIEF DESCRIPTION OF THE DRAWINGS

So that the manner in which the above recited features of the embodiments disclosed above can be understood in detail, a more particular description, briefly summarized above, may be had by reference to the following embodiments, some of which are illustrated in the appended drawings. It is to be noted, however, that the appended drawings illustrate only typical embodiments and are therefore not to be considered limiting of its scope to exclude other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The embodiments disclosed generally relate to a susceptor for thermal processing of semiconductor substrates. The embodiments disclosed can improve thermal uniformity across the surface of a substrate during processing by reducing a contacting surface area between the susceptor and the substrate. Reducing the contacting surface area between the susceptor and the substrate reduces the amount of heat that is transferred from the susceptor to the substrate by conduction during processing. Embodiments of some structures that can reduce the contacting surface area between the substrate and the susceptor are described below.

Figure 1A:
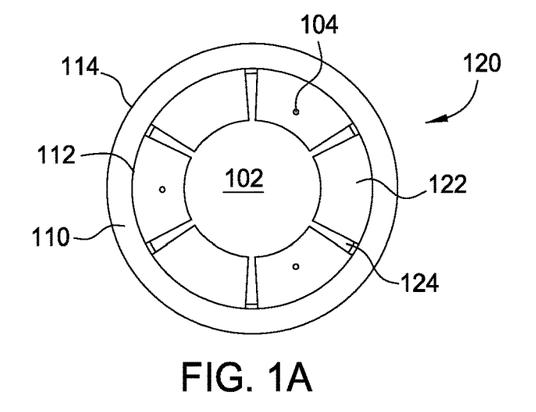
FIG. 1A is a top sectional view of a susceptor, according to one embodiment.

FIG. 1A is a top sectional view of a susceptor 120, according to one embodiment. The susceptor 120 includes an outer rim 110 surrounding and coupled to an inner dish 102. The inner dish 102 could be concave with the center of the inner dish being slightly lower than the edges of the inner dish 102. The outer rim 110 includes an inner edge 112 and an outer edge 114. Susceptors, such as susceptor 120, are generally sized so that the substrate to be processed on the susceptor fits just inside the outer rim, such as the outer rim 110. The susceptor 120 further includes lift pins 104 to aid in transferring substrates into and out of a thermal processing chamber (not shown) housing the susceptor 120.

The susceptor 120 further includes six wedges 122 for reducing a contacting surface area between a substrate (not shown) and the susceptor 120 when the substrate is supported by the susceptor 120, wherein the wedges 122 contact the inner dish 102 proximate the inner edge 112 of the outer rim 110. The wedges 122 may be formed as an integral part of the susceptor 120, or may be attached to the susceptor, for example by welding. Each wedge 122 extends radially inward from the inner edge 112 of the outer rim 110 and each wedge is separated from two other wedges by a gap 124. The gaps 124 correspond to areas of the underside of the substrate that will not contact the susceptor 120 allowing for more heat to be radiated from the susceptor 120 to the substrate during processing while reducing conductive heating at the substrate edge. Each wedge 122 is an elevated structure relative to an upper surface of the inner dish 102. The wedges 122 can be symmetrically arranged around the center of the inner dish 102. Each wedge 122 could contact the inner edge 112 of the outer rim 110 and each wedge 122 could have an upper surface higher than the upper surface of the inner dish 102. The inner dish, outer rim as well as the wedges could be fabricated from silicon carbide, silicon carbide coated graphite, graphite coated with glassy carbon, or other materials with high thermal conductivity.

Figure 1B:
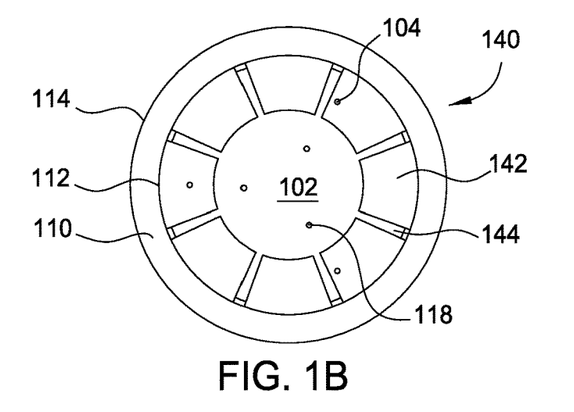
FIG. 1B is a top sectional view of a susceptor, according to another embodiment.
Figure 1C:
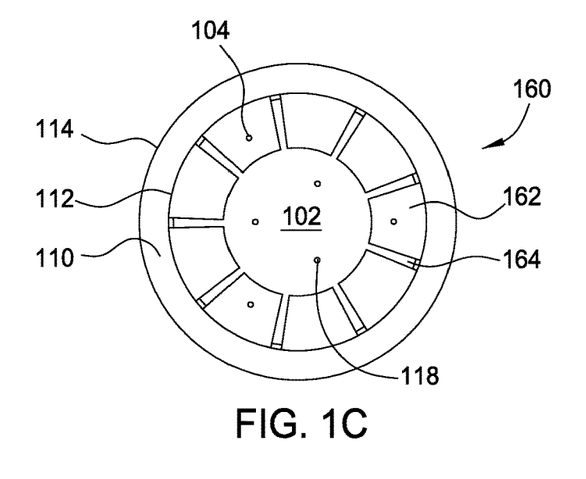
FIG. 1C is a top sectional view of a susceptor, according to another embodiment.

Although six wedges 122 are shown in FIG. 1A, two or more wedges can be used in different embodiments. FIG. 1B shows a top sectional view of a susceptor 140 with eight wedges 142 separated by gaps 144. FIG. 1C shows a top sectional view of a susceptor 160 with nine wedges 162 separated by gaps 164. In some embodiments, additional wedges can improve thermal uniformity during processing by reducing the size of the individual surface areas on the susceptor (i.e., the top surface of each wedge) transferring heat to the substrate by conduction. Additional wedges can improve thermal uniformity at the edges of the substrate because there are more gaps where the substrate is not contacting another surface. This improved thermal uniformity helps prevent hotspots from forming along the edges.

Susceptors 140 and 160 further include three rounded bumps 118 extending from the upper of the inner dish 102. Each bump 118 is located closer than each wedge 142, 162 to a center of the inner dish 102. The bumps 118 could be fastened to inner dish 102 through a threaded connection or other common fastening means. The bumps 118 may be made of the same material as the susceptor, or a different material, and may be made from silicon carbide, or graphite coated with silicon carbide or glassy carbon. When substrates are supported around the edges, such as when a susceptor is used during processing, the center of the substrate can sag below the edges of the substrate. Susceptor dishes, such as the inner dish 102, are often slightly concave to prevent portions of an underside of a sagging substrate from contacting the susceptor dish during processing. On the other hand, to create the highly uniform process conditions in epitaxy, the distance between the upper surface of the inner dish and the lower surface of the substrate is kept quite low, for example less than 0.25 mm. If the substrate contacts the dish, heat is transferred from the inner dish to the substrate by conduction and thermal uniformity may be reduced.

The bumps 118 can be used to support a sagging substrate preventing contact between the inner dish 102 and the substrate. The bumps 118 provide a contact surface area between the sagging substrate and the susceptor that is smaller than the surface area of the substrate that would contact the inner dish 102 absent the bumps 118. The bumps 118 can be evenly distributed around the center of the inner dish 102 as shown in FIGS. 1B and 1C. In some embodiments, to ensure adequate support of a sagging substrate there could always be at least one bump 118 on a side of the inner dish 102.

Figure 1D:
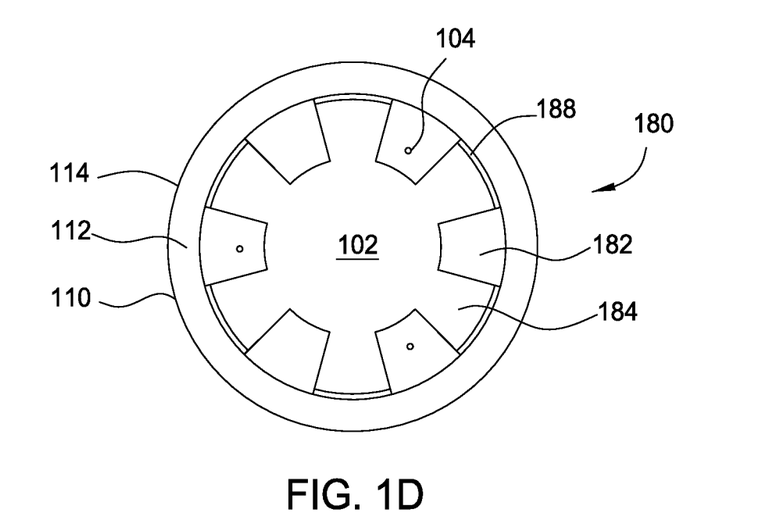
FIG. 1D is a top sectional view of a susceptor, according to another embodiment.

FIG. 1D is a top sectional view of a susceptor 180, according to another embodiment. The susceptor 180 further includes six wedges 182 for reducing a contacting surface area between a substrate (not shown) and the susceptor 180 when the substrate is supported by the susceptor 180, wherein the wedges 182 contact the inner dish 102 proximate the inner edge 112 of the outer rim 110. Each wedge 182 extends radially inward from the inner edge 112 of the outer rim 110 and each wedge is separated from two other wedges by a gap 184. The gap 184 is larger than the gap 124 shown in FIG. 1A to further reduce the contacting surface area between the substrate and the susceptor. Susceptor 180 further includes an insulating separator 188 disposed between each of the wedges 182.

Figure 1E:
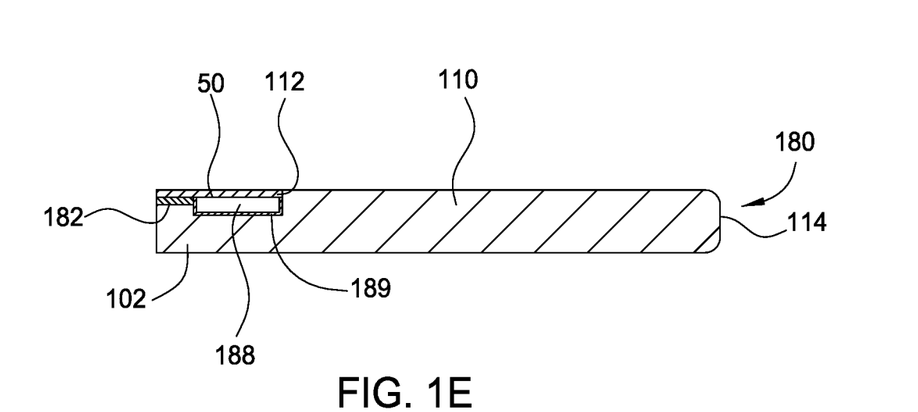
FIG. 1E is a partial cross sectional view of a susceptor, according to the embodiment shown in FIG. 1D.

FIG. 1E is a partial cross sectional view of the susceptor 180, according to the embodiment shown in FIG. 1D. The cross sectional view shows the top of the wedge 182 at the same height as the top of the insulating separator 188. A substrate 50 is shown resting on the top of the wedge 182 and the insulating separator 188. The insulating separator 188 may be disposed in a groove 189 formed around the susceptor surface near the inner edge 112 of the outer rim 110, or at the specified radial location of the insulating separator 188. The groove 189 maintains the insulating separator 188 in a specified location. The insulating separator 188 typically has a thickness that is greater than a depth of the groove 189 so an upper surface of the insulating separator 188 rises above the surrounding surface of the susceptor 220, thus reducing contact between a substrate edge and the susceptor surface.

The insulating separators 188 are typically made from a thermally insulating material, such as silicon oxide, quartz of any type (i.e. amorphous, crystalline, optical, bubble, etc.), glass, or the like. The insulating separators 188 provide thermal breaks, or areas of reduced thermal conductivity, around the inner dish during processing. This thermal break reduces thermal conduction into the edge of the substrate from the susceptor, which is typically made from a high thermal conductivity material. Reduced contact between the substrate edge and the highly conductive susceptor material reduces conductive heating of the substrate edge during processing. The insulating separators 188 may contact the inner edge 112 of the outer rim 110, but could also be disposed at other locations on a susceptor. For example the insulating separators 188 may be spaced apart from the inner edge 112 of the outer rim 110.

Figure 2A:
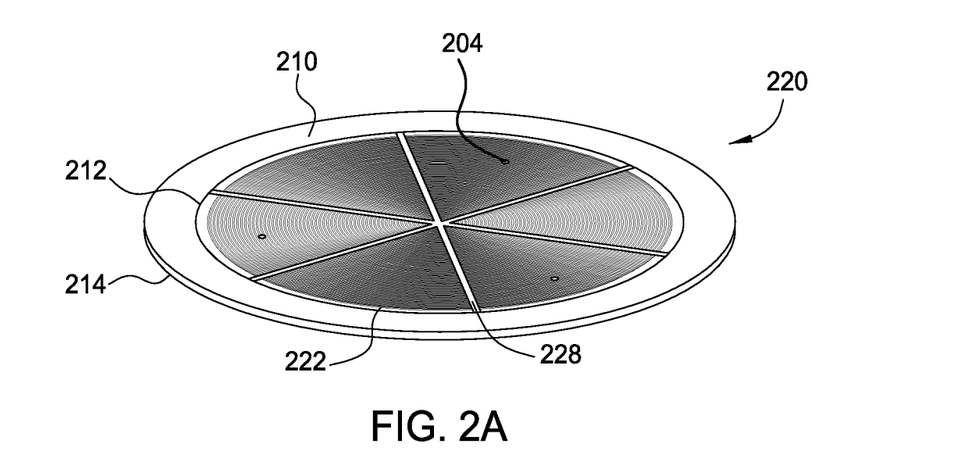
FIG. 2A is a top sectional view of a susceptor, according to another embodiment.
Figure 2B:
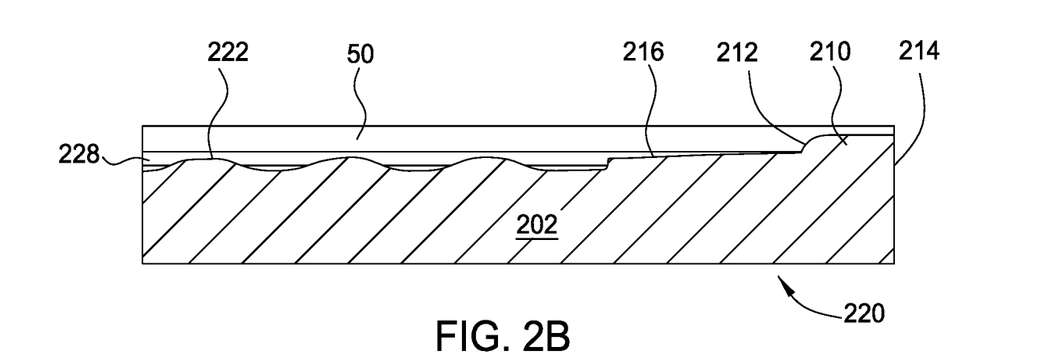
FIG. 2B is a partial cross sectional view of a susceptor, according to the embodiment shown in FIG. 2A.

FIG. 2A is a top sectional view of a susceptor 220, according to another embodiment. FIG. 2B is a partial cross sectional view of the susceptor 220. Referring to FIGS. 2A and 2B, the susceptor 220 is similar to the susceptor 120 including an outer rim 210 surrounding an inner dish 202, the outer rim 210 having an inner edge 212 and an outer edge 214. Three lift pins 204 can extend above the inner dish 202.

The susceptor 220 includes concentric annular ridges 222 surrounding the center of the inner dish 202. Each annular ridge 222 has a different diameter. At least some of the annular ridges 222 can be located proximate the inner edge 212 of the outer rim 210. In some embodiments, some of the annular ridges 222 may be located within about 1 mm of the inner edge 212, for example within about 0.5 mm of the inner edge 212. The susceptor 220 may further include six spokes 228 extending from the center of the inner dish 202 to the inner edge 212 of the outer rim 210. More or fewer spokes 228 may be included in different embodiments. Each spoke 228 extends to a different angular location around the inner edge 212 of the outer rim 210. In some embodiments, the upper surface of each spoke 228 is above the tops of the annular ridges 222. In other embodiments, the upper surface of each spoke could be at substantially the same height as the tops of the annular ridges 222. In some embodiments, the annular ridges 222 continue under or through the spokes 228 making a complete ring around the center of the inner dish 202. In other embodiments, the spokes 228 separate portions of the annular ridges 222.

The spokes 228 and annular ridges 222 can reduce a contacting surface area between a substrate 50 and the susceptor 220 when the substrate 50 is supported by the susceptor 220. In some embodiments, the substrate 50 may only contact the spokes 228 during processing without contacting the annular ridges 222. In other embodiments, the substrate 50 may contact both the spokes 228 and at least some of the annular ridges 222 during processing. In some embodiments, the one or both of the annular ridges 222 and the spokes 228 or their respective upper surfaces are elevated structures relative to the upper surface of the inner dish 202. The ridges 222 may also improve thermal uniformity when processing a substrate by increasing radiative surface area of the upper surface of the susceptor 220.

The spokes 228 and annular ridges 222 may be made of the same material or a different material, which may be any of the same materials from which the susceptor 220 is made. The spokes 228 and annular ridges 222 may be made, in one embodiment, by sculpting the annular ridges 222 from an unpatterned susceptor dish surface. In another embodiment, recesses may be formed in an unpatterned susceptor dish surface to define the spokes, and then a pattern of ridged pieces attached to the susceptor surface within the recesses to form the annular ridges 222, for example by welding.

In some embodiments, the susceptor 220 can include an angled surface 216 connecting the inner dish 202 as well as the spokes 228 and annular ridges 222 to the inner edge 212 of the outer rim 210. The angled surface 216 can be used as part of a supporting surface for the substrate 50. Varying the slope or dimensions of the angled surface 216 can control the height of the substrate 50 relative to the spokes 228 and the annular ridges 222.

Figure 2C:
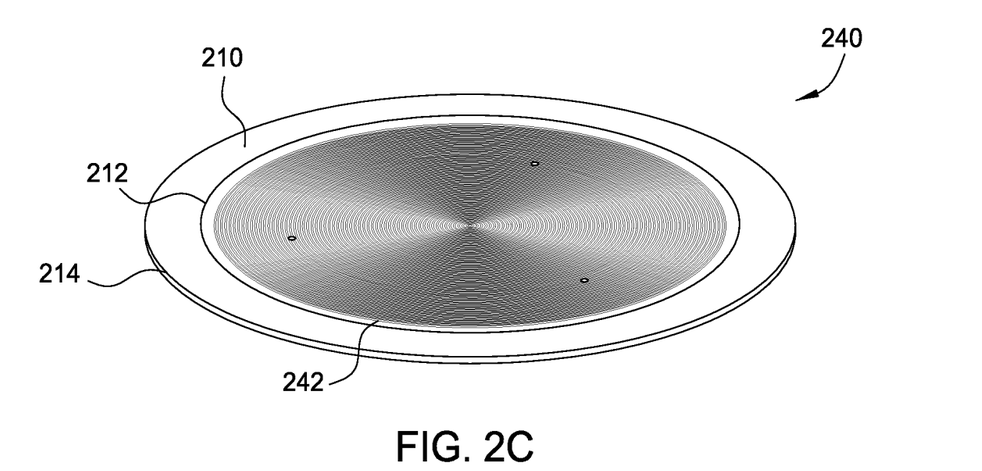
FIG. 2C is a top sectional view of a susceptor, according to another embodiment.

FIG. 2C is a top sectional view of a susceptor 240, according to another embodiment. Susceptor 220 is similar to susceptor 240 except that susceptor 240 does not include any spokes 228. Susceptor 240 includes annular ridges 242 that are similar to annular ridges 222. When a substrate is placed on susceptor 240, the underside of the substrate could contact at least some of the annular ridges 242 in some embodiments. In other embodiments, there could be a small gap between the underside of the substrate and the tops of the annular ridges 242 as the substrate is supported by a separate surface, such as angled surface 216 of FIG. 2B.

Figure 3A:
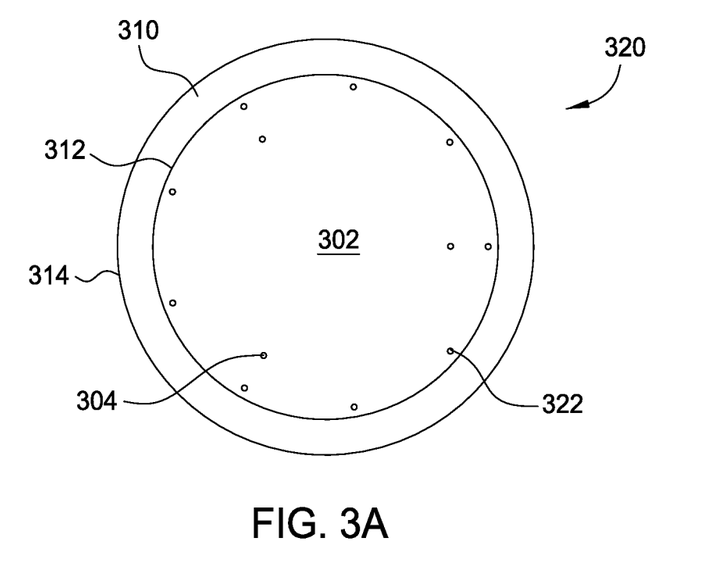
FIG. 3A is a top sectional view of a susceptor, according to another embodiment.
Figure 3B:
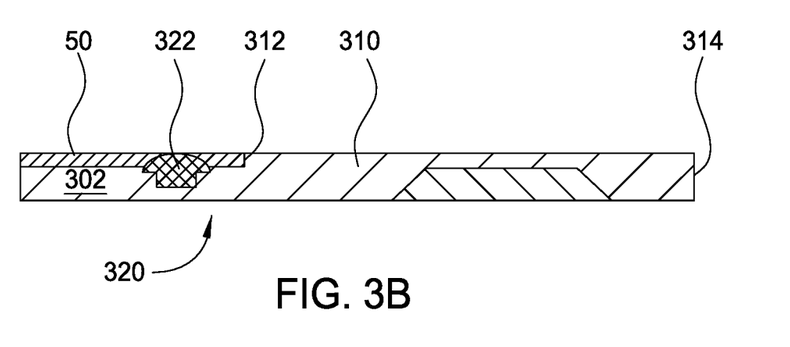
FIG. 3B is a partial cross sectional view of a susceptor, according to the embodiment shown in FIG. 3A.

FIG. 3A is a top sectional view of a susceptor 320, according to another embodiment. FIG. 3B is a partial cross sectional view of the susceptor 320. Referring to FIGS. 3A and 3B, the susceptor 320 is similar to the susceptor 120 including an outer rim 310 surrounding an inner dish 302, the outer rim 310 having an inner edge 312 and an outer edge 314. Three lift pins 304 can extend above the inner dish 302.

The susceptor 320 includes a series of bumps 322 extending from an upper surface of the inner dish 302, so at least part of each bump is elevated above the inner dish 302. At least some of the bumps 322 can be located proximate the inner edge 312 of the outer rim 310. In some embodiments, some of the bumps 322 may be located within about 1 mm of the inner edge 312, for example within about 0.5 mm of the inner edge 312. Bumps 322 are arranged in a ringed pattern on the inner dish 302, but other arrangements could be used, such as multiple rings, a triangular, square, or rectangular pattern, or a gridded pattern. In some embodiments, each quadrant of the inner dish 302 could include at least one bump 322. The bumps 322 could be fastened to inner dish 302 through a threaded connection or other common fastening means.

The bumps 322 can reduce a contacting surface area between a substrate 50 and the susceptor 320 when the substrate 50 is supported by the susceptor 320. In some embodiments, the substrate 50 may only contact the bumps 322 during processing without contacting the inner dish 302 or any other surface. When the substrate 50 is supported using bumps 322, hot spots around the edges of the substrates are greatly reduced. In other embodiments, additional bumps, such as bumps 118 shown in FIGS. 1B and 1C could extend up from inner dish 302 at locations closer to the center of the inner dish 302 to prevent a sagging substrate from contacting the inner dish 302.

The bumps 322 are typically made from a low thermal conductivity material, such as silicon oxide, quartz of any type, glass, etc. The bumps provide a raised contact for the edge of a substrate disposed on the susceptor 320 to reduce conductive heating of the substrate edge. The bumps 322 may be inserted into recesses formed in the surface of the susceptor 320. Features may be added to the bumps 322 and the recesses to allow the bumps 322 to be secured in the susceptor surface. Such features may include threads or other rotational engagement structures.

Figure 4:
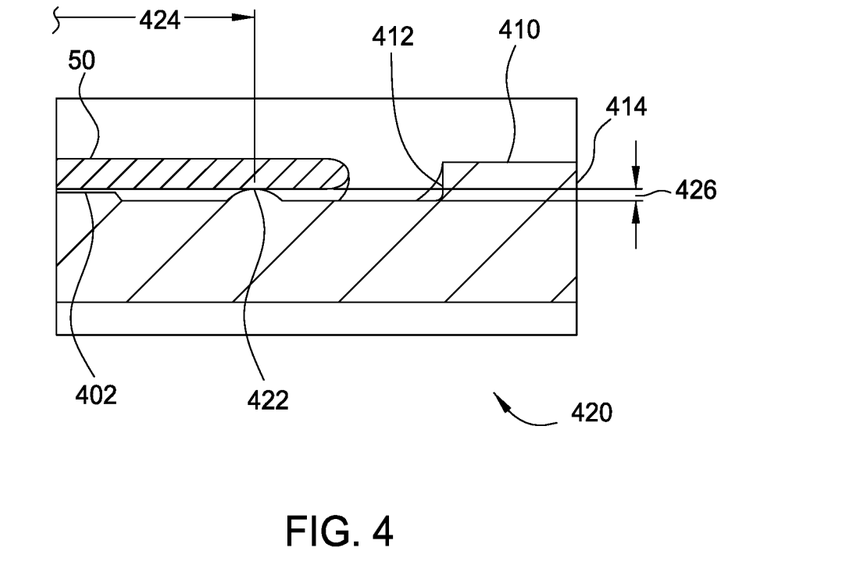
FIG. 4 is a partial cross sectional view of a susceptor, according another embodiment.

FIG. 4 is a partial cross sectional view of a susceptor 420, according another embodiment. The susceptor 420 is similar to the susceptor 120 including an outer rim 410 surrounding an inner dish 402, the outer rim 410 having an inner edge 412 and an outer edge 414. Three lift pins (not shown) could extend above the inner dish 402.

The susceptor 420 includes an annular ridge 422 extending from an upper surface of the inner dish 402, so at least part of the annular ridge is elevated above the inner dish 402. The annular ridge can surround the center of the inner dish 402 at a a radial distance 424 from the center of the inner dish 402 that is less than the radius of a substrate 50 to be supported by the susceptor 420. The annular ridge 422 may be made of a high thermal conductivity material, such as silicon carbide or graphite coated with silicon carbide or glassy carbon. A height 426 of the annular ridge 422 can be designed to control the gap between the substrate 50 and the inner dish 402. In some embodiments, two or more annular ridges 422 could extend from the upper surface of the inner dish 402. The additional annular ridges (not shown) could have different diameters as well as different heights from the other annular ridges. Annular ridge 422 is arranged in a ringed pattern on the inner dish 402, but other arrangements could be used, such as multiple rings, a triangular, square, or rectangular pattern, or a gridded pattern. The annular ridge 422 can be located proximate the inner edge 412 of the outer rim 410. In some embodiments, some of the annular ridges 422 may be located within about 1 mm of the inner edge 412, for example within about 0.5 mm of the inner edge 412.

The annular ridge 422 can reduce a contacting surface area between a substrate 50 and the susceptor 420 when the substrate 50 is supported by the susceptor 420. In some embodiments, the substrate 50 may only contact the annular ridge 422 during processing without contacting the inner dish 402 or any other surface. The radial location 424 as well as the height 426 of the annular ridge 422 could be modified to achieve different thermal profiles during processing. In other embodiments, bumps, such as bumps 118 shown in FIGS. 1B and 1C could extend from inner dish 402 at locations closer to the center of the inner dish 402 to prevent a sagging substrate from contacting the inner dish 402.

Figure 5:
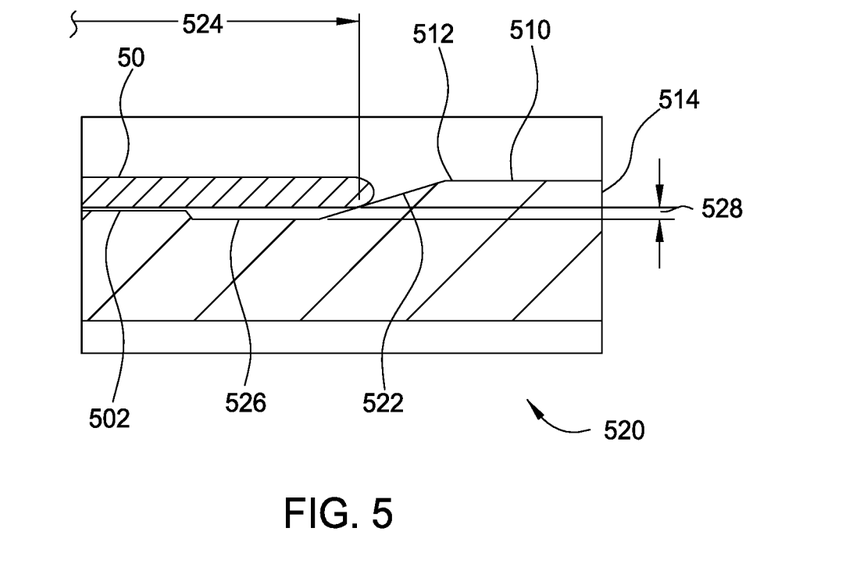
FIG. 5 is a partial cross sectional view of a susceptor, according another embodiment.

FIG. 5 is a partial cross sectional view of a susceptor 520, according another embodiment. The susceptor 520 is similar to the susceptor 120 including an outer rim 510 surrounding an inner dish 502, the outer rim 510 having an inner edge 512 and an outer edge 514. Three lift pins (not shown) could extend above the inner dish 502.

The susceptor 520 includes an angled surface 522 extending radially inward from the inner edge 512 of the outer rim 510 to a depression 526. At least part of angled surface 522 is an elevated structure relative to the upper surface of the inner dish 502. The upper surface of the depression 526 is located below the upper surface of the inner dish 502. The upper surface of the depression 526 couples the angled surface 522 to the upper surface of the inner dish 502. The angled surface 522 could be angled between about three degrees and about twenty degrees from the upper surface of the inner dish 502, such as between about four degrees and about twelve degrees, for example about seven degrees. The angle and location of the angled surface 522 can be used to control a radial location 524 corresponding to where the substrate 50 can contact the angled surface 522 during processing. The angle and location of the angled surface 522 can also be used to control the size of a gap 528 between the bottom of the substrate 50 and the upper surface of the depression 526. The size of the gap 528 could be between 0.1 mm and 1 mm, for example about 0.3 mm.

The angled surface 522 can reduce a contacting surface area between a substrate 50 and the susceptor 520 when the substrate 50 is supported by the susceptor 520. In some embodiments, the substrate 50 may only contact the angled surface 522 during processing without contacting the inner dish 502 or any other surface. By using a relatively steep angle, such as between about three degrees and about twenty degrees from the upper surface of the inner dish 502, such as between about four degrees and about twelve degrees, for example about seven degrees, a smaller surface area of the substrate edge contacts the susceptor during processing, which reduces the amount of conductive heat that can be transferred from the susceptor 520 to the substrate 50. The angle and location of the angled surface 522 could be modified to achieve different thermal profiles during processing. In some embodiments, bumps, such as bumps 118, shown in FIGS. 1B and 1C could extend from inner dish 502 at locations closer to the center of the inner dish 502 to prevent a sagging substrate from contacting the inner dish 502.

The susceptor embodiments described herein allow for more uniform temperature control of substrates during thermal processes, such as epitaxy. The temperature control is improved by reducing the surface area of the substrate contacting the susceptor, which reduces the amount of conductive heat transferred from the susceptor and the substrate. Conductive heat transfer between the susceptor and the substrate is more difficult to control than radiant heat transfer, the primary source of heat transfer between the susceptor and the substrate. Reducing the surface area of the substrate contacting the susceptor allows for a higher percentage of the heat transfer to be radiant heat resulting in improved temperature control and improved depositions on the substrate. The embodiments disclosed reduce the conductive heat transfer near the edge of the substrate by adding a structure, such as a annular ridge around the center of the inner dish proximate the outer rim, to reduce the contacting surface area between the susceptor and the substrate. The embodiments disclosed also prevent the possibility of substantial amounts of conductive heat transfer near the center of the substrate by including three bumps to support a substrate above the inner dish if the substrate sags.

Although the foregoing embodiments have been described using circular geometries (e.g., inner dish, outer rim, annular ridge, etc.) to be used on semiconductor "wafers," the embodiments disclosed can be adapted to conform to different geometries.

While the foregoing is directed to typical embodiments, other and further embodiments may be devised without departing from the basic scope thereof, and the scope thereof is determined by the claims that follow.

The invention claimed is:

1. A method of processing a substrate comprising:
    positioning an outer portion of a substrate on:
        a plurality of wedges extending radially inward from an inner edge of an outer rim above an inner dish of a susceptor, wherein each wedge is separated from two other wedges by a gap and the outer rim is elevated relative to the plurality of wedges; and
        an insulating separator disposed between each of the wedges, each insulating separator contacting two wedges and the inner edge of the outer rim; and
    supporting an inner portion of the substrate with one or more bumps of a plurality of bumps, each bump located closer than each wedge to a center of the inner dish;
    performing a process on the substrate inside a process chamber.

2. The method of claim 1, wherein the plurality of bumps comprises at least three bumps.

3. The method of claim 1, wherein the plurality of bumps consists of three bumps.

4. The method of claim 3, wherein no bisection of the inner dish comprises all three bumps.

5. The method of claim 1, wherein the plurality of wedges comprises six wedges.

6. The method of claim 1, wherein the plurality of wedges comprises eight wedges.

7. The method of claim 1, wherein a top surface of each of the wedges is at a same height as a top surface of each of the insulating separators.

8. The method of claim 1, wherein the insulating separators are quartz.

9. The method of claim 1, wherein a first inner sagging portion of the substrate is supported by a first bump of the plurality of bumps and a second inner sagging portion of the substrate is supported by a second bump of the plurality of bumps when performing the process on the substrate.

10. The method of claim 1, wherein each bump of the plurality of bumps is fastened to the inner dish.

11. The method of claim 1, wherein each bump of the plurality of bumps is formed of a same material as the inner dish of the susceptor.

12. A method of processing a substrate comprising:
setting the substrate in a processing position on an inner dish of a susceptor disposed in a process chamber, the inner dish comprising an inner portion having a first upper surface and an outer depression having a second upper surface below the first upper surface, the setting comprising:
positioning an outer portion of a substrate on a supporting structure of the susceptor, wherein the supporting structure extends to a first height above the first upper surface and the second upper surface of the inner dish of the susceptor; and
supporting an inner portion of the substrate with one or more bumps extending from an upper surface of the inner dish of the susceptor, wherein a height of the one or more bumps is below the first height of the supporting structure; and
performing a process on the substrate inside the process chamber when the outer portion of the substrate is positioned on the supporting structure and the inner portion of the substrate is supported by the one or more bumps, wherein the process performed on the substrate is a deposition of a layer on the substrate.

13. The method of claim 12, wherein the one or more bumps comprises at least three bumps.

14. The method of claim 12, wherein the one or more bumps consists of three bumps.

15. The method of claim 14, wherein no bisection of the inner dish comprises all three bumps.

16. A method of processing a substrate comprising:
setting the substrate in a processing position on an inner dish of a susceptor disposed in a process chamber, the inner dish comprising an inner portion having a first upper surface and an outer depression having a second upper surface below the first upper surface, the setting comprising:
positioning an outer portion of a substrate on a supporting structure of the susceptor, wherein the supporting structure extends to a first height above the first upper surface and the second upper surface of the inner dish of the susceptor; and
supporting an inner portion of the substrate with one or more bumps extending from an upper surface of the inner dish of the susceptor, wherein a height of the one or more bumps is below the first height of the supporting structure; and
performing a process on the substrate inside the process chamber when the outer portion of the substrate is positioned on the supporting structure and the inner portion of the substrate is supported by the one or more bumps, wherein a first inner sagging portion of the substrate is supported by a first bump of the one or more bumps and a second inner sagging portion of the substrate is supported by a second bump of the one or more bumps.

17. The method of claim 16, wherein the one or more bumps comprises at least three bumps.

18. The method of claim 16, wherein the one or more bumps consists of three bumps.

19. The method of claim 18, wherein no bisection of the inner dish comprises all three bumps.

20. The method of claim 16, wherein each bump of the one or more bumps is formed of a same material as the inner dish of the susceptor.

* * * * *